US012733514B2

(12) United States Patent
Ichikawa et al.

(10) Patent No.: US 12,733,514 B2
(45) Date of Patent: Sep. 8, 2026

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Keitaro Ichikawa, Tokyo (JP); Yuji Shikasho, Tokyo (JP); Takuya Sakamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 787 days.

(21) Appl. No.: 18/058,705

(22) Filed: Nov. 23, 2022

(65) Prior Publication Data

US 2023/0238311 A1 Jul. 27, 2023

(30) Foreign Application Priority Data

Jan. 25, 2022 (JP) ................................ 2022-009491

(51) Int. Cl.
*H10W 70/40* (2026.01)
*H10W 70/04* (2026.01)
(Continued)

(52) U.S. Cl.
CPC ....... *H10W 70/429* (2026.01); *H10W 70/048* (2026.01); *H10W 74/016* (2026.01); *H10W 74/111* (2026.01)

(58) Field of Classification Search
CPC ........... H01L 23/49555; H01L 23/3107; H01L 21/4842; H01L 21/565; H10W 90/756;
(Continued)

(56) References Cited

U.S. PATENT DOCUMENTS 6,444,905 B1 * 9/2002 Miyaki ............. H01L 23/49541 257/696
8,435,867 B2 * 5/2013 Fujishima ............. H01L 21/565 257/E21.599
(Continued)

FOREIGN PATENT DOCUMENTS

JP S62-043159 A 2/1987
JP S62-163352 A 7/1987
(Continued)

OTHER PUBLICATIONS

"Notice of Reasons for Refusal" Office Action issued in JP 2022-009491; mailed by the Japanese Patent Office on Oct. 29, 2024.

*Primary Examiner* — Zandra V Smith
*Assistant Examiner* — John M Parker
(74) *Attorney, Agent, or Firm* — Studebaker Brackett PLLC

(57) ABSTRACT

A semiconductor device includes a sealing resin being an insulating resin sealing the semiconductor element therein, and a plurality of electrode terminals each including a root portion being a root protruding from the sealing resin, a tip portion being a tip and portion extending from the root portion, and a middle portion provided between the tip portion and the root portion, and the middle portion includes first middle portions having a width wider than those of the root portion and the tip portion in the first direction, and a second middle portion having a width wider than those of the root portion and the tip portion in the first direction, a width narrower than those of the first middle portions in the first direction, and a bent portion bent toward in a third direction orthogonal to the first direction and the second direction.

15 Claims, 20 Drawing Sheets

(51) Int. Cl.
*H10W 74/01* (2026.01)
*H10W 74/10* (2026.01)

(58) Field of Classification Search
CPC ............. H10W 70/421; H10W 70/429; H10W 70/427; H10W 70/048; H10W 74/111; H10W 74/016
See application file for complete search history.

(56) References Cited

U.S. PATENT DOCUMENTS

| | | | | |
|---|---|---|---|---|
| 2003/0067058 | A1* | 4/2003 | Abe | H01L 23/49541 438/123 |
| 2003/0214026 | A1* | 11/2003 | Tokuhara | H01L 23/13 257/692 |
| 2011/0198739 | A1* | 8/2011 | Amanai | H01L 21/268 257/667 |
| 2015/0001691 | A1* | 1/2015 | Higgins, III | H01L 23/49541 438/123 |
| 2016/0093561 | A1* | 3/2016 | Tabira | H01L 24/97 257/676 |
| 2020/0303295 | A1 | 9/2020 | Ichikawa et al. | |

FOREIGN PATENT DOCUMENTS

| | | | |
|---|---|---|---|
| JP | H11-317484 | A | 11/1999 |
| JP | 2006-041137 | A | 2/2006 |
| JP | 2015-090960 | A | 5/2015 |
| JP | 2020-155706 | A | 9/2020 |

* cited by examiner

FIG. 2
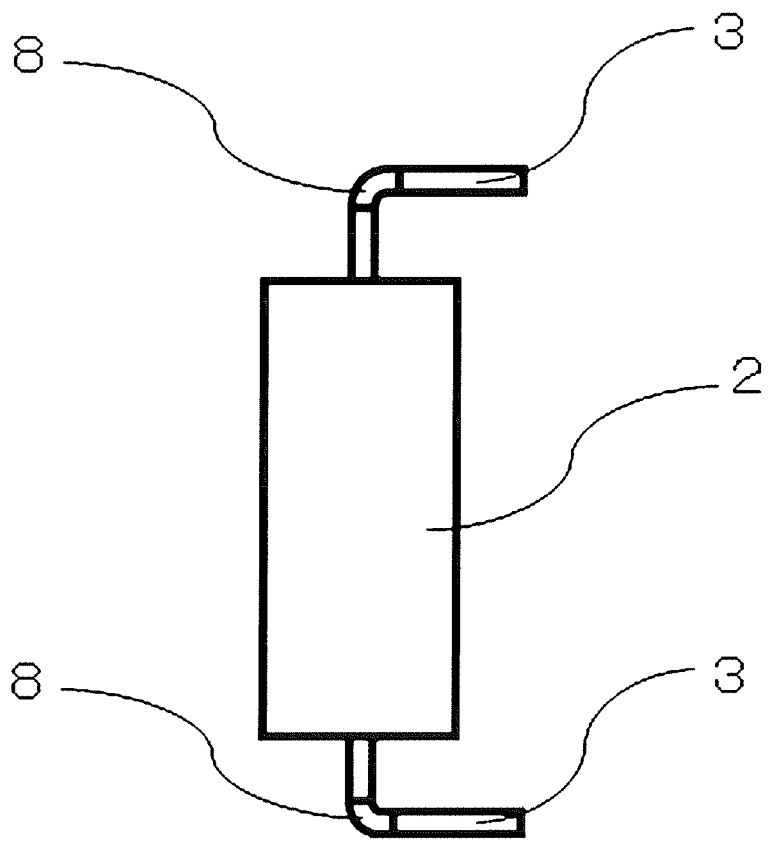

F I G. 5
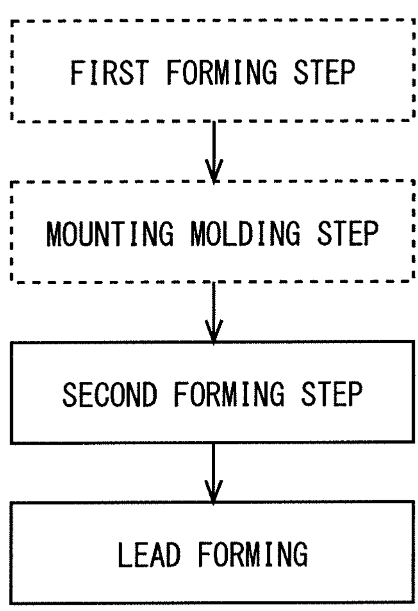

F I G. 7
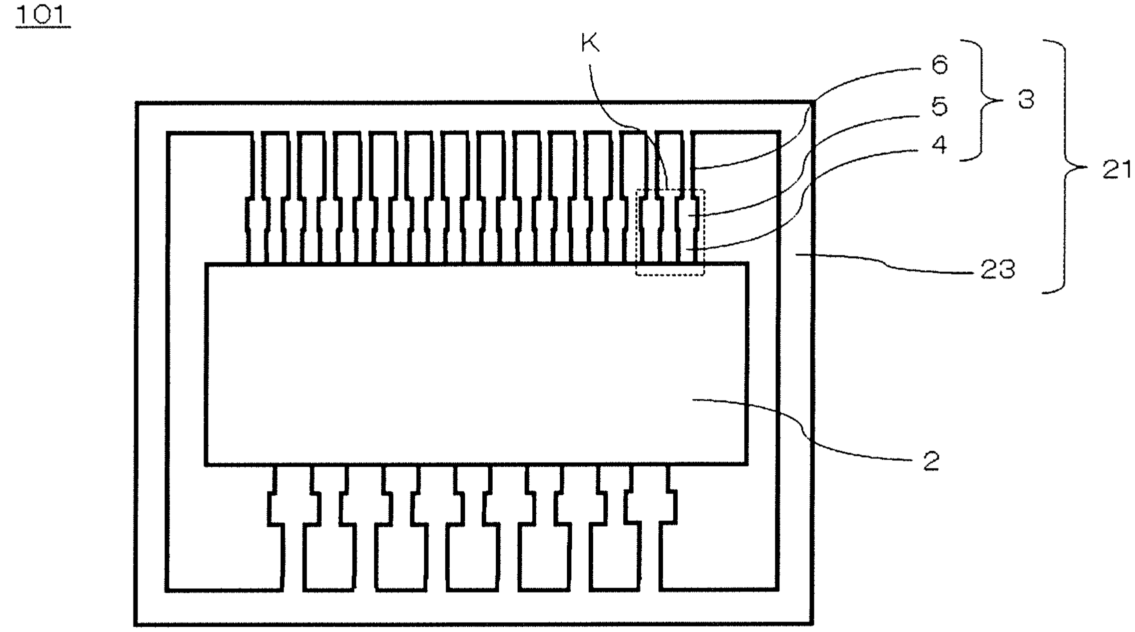

F I G. 1 1
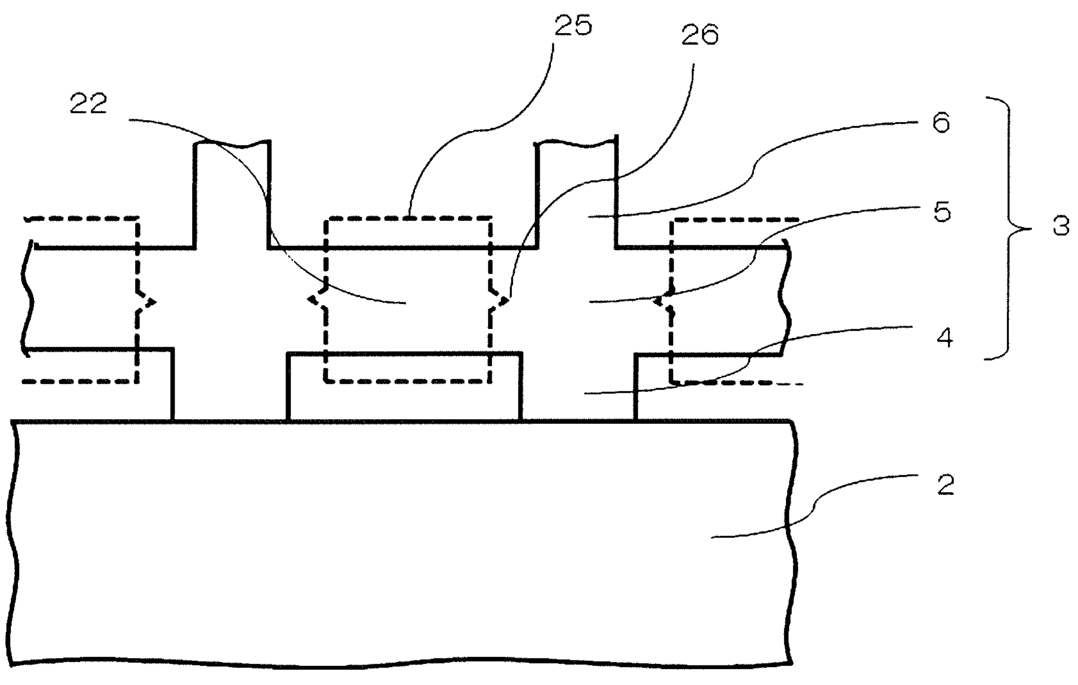

F I G. 1 7
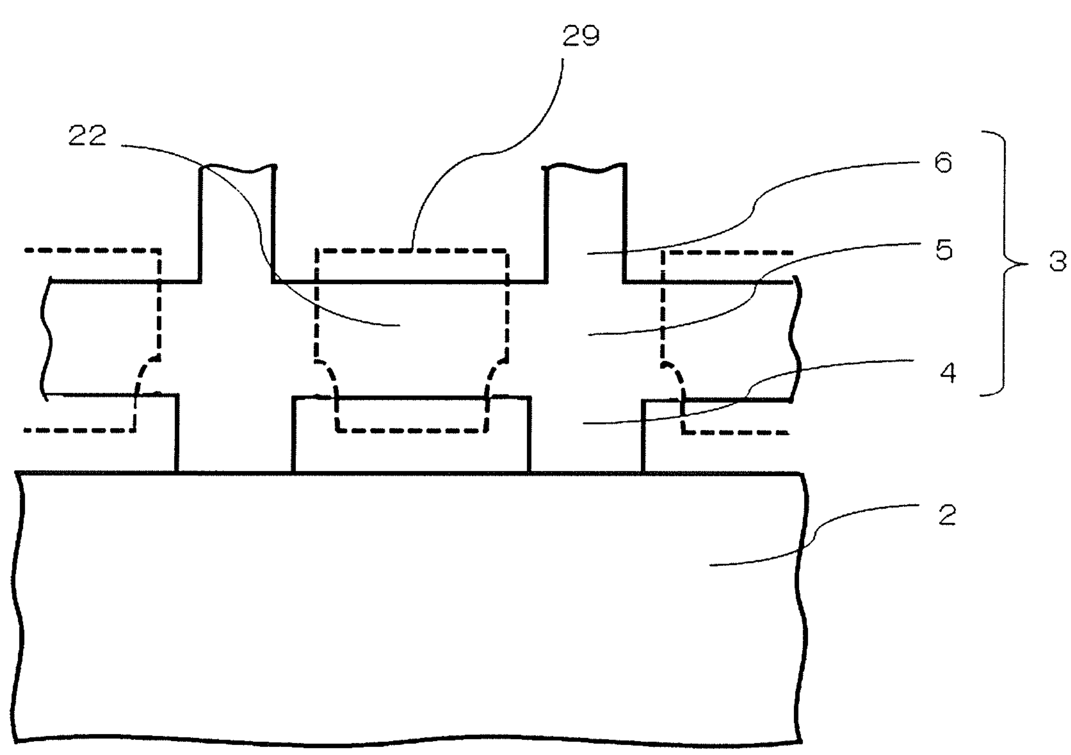

F I G. 1 8
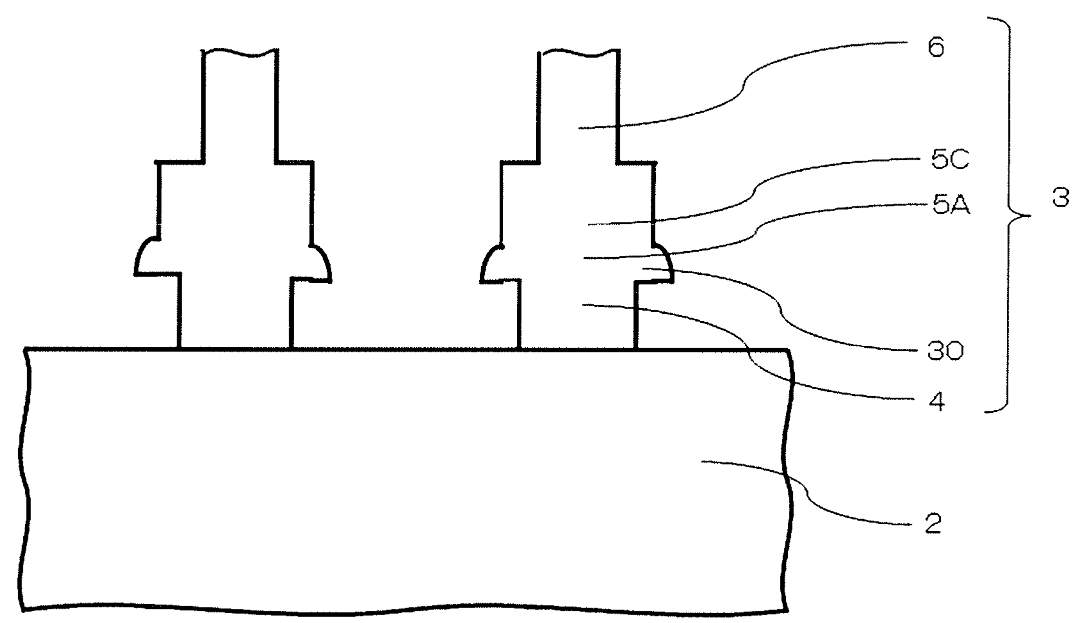

SEMICONDUCTOR DEVICE AND METHOD OF MANUFACTURING SEMICONDUCTOR DEVICE

BACKGROUND OF THE INVENTION

Field of the Invention

The present disclosure relates to a semiconductor device and a method of manufacturing the semiconductor device.

Description of the Background Art

There has been a semiconductor device including an insulating sealing with semiconductor elements and control terminals embedded therein, conductive electrode terminals protruding from side surfaces of the sealing resin, and the electrode terminals bent at a right angle or an obtuse angle.

In such a semiconductor device, if the width of the bent portion of an electrode terminal is large, it may lead to bending deformation easily when the electrode terminal is bent. In order to suppress such deterioration in bending workability, for example, in Japanese Patent Application Laid-Open No. 11-317484, a technique is disclosed where an electrode terminal protruding from an insulating resin sealing portion has, in order from the sealing portion side, a root portion, a middle portion wider in width than the root portion, and a tip portion having a narrowest width, a narrow portion narrowed in width is provided in the middle portion, and the electrode terminal is bent at this narrow portion.

In Japanese Patent Application Laid-Open No. 11-317484, however, there has been a problem in which the strength of the electrode terminal lowers due to the narrowed bent portion width thereof and the electrode terminal is easily broken or deformed, or accuracy of bending position and bending direction during lead forming, that is, bending accuracy is prone to deteriorate. On the other hand, the electrode terminal with wide width involves a problem in which the electrode terminal bulges in the width direction when the electrode terminal is bent, easily causing and an insulation failure between the electrode terminals adjacent to each other.

SUMMARY

An object of the present disclosure is to obtain a semiconductor device capable of suppressing poor insulation of electrode terminals and suppressing breakage of the electrode terminals due to insufficient strength of the electrode terminals.

According to the present disclosure, the semiconductor device includes a conductive die bond, a semiconductor element electrically connected to the die bond, a sealing resin being an insulating resin sealing the semiconductor element therein, and a plurality of electrode terminals electrically connected to the die bond and protruding from the sealing resin each including a root portion being a root protruding from the sealing resin, a tip portion being a tip and portion extending from the root portion, and a middle portion provided between the tip portion and the root portion, in which the plurality of electrode terminals are aligned along a first direction and protrude from the sealing resin in a second direction orthogonal to the first direction, and the middle portion includes a first middle portion having a width wider than those of the root portion and the tip portion in the first direction, and a second middle portion having a width wider than that of the root portion in the first direction, and a width narrower than that of the first middle portion in the first direction, and having a bent portion bent toward in a third direction orthogonal to the first direction and the second direction.

According to the present disclosure, the method of manufacturing a semiconductor device includes a first forming step forming, by processing a metal material having a flat-plate shape, root portions of a plurality of electrode terminals arranged along a first direction and extending in a second direction orthogonal to the first direction, top portions of which tips are connected to an outer frame made of the metal material, and middle portions each of which is connected by a connecting portion provided between the root portion and the tip portion, a mounting molding step mounting a semiconductor element to electrically connect the metal material in which the root portions, the tip portions and middle portions are formed, and sealing the semiconductor element with an insulating resin, a second forming step removing the connecting portions and the outer frame, and forming, in the middle portions, first middle portions each having a width wider than those of the root portion and the tip portions in the first direction, and second middle portions each having a width wider than that of the root portion in the first direction and narrower than that of the first middle portions in the first direction, and a lead forming step bending, in the second middle portions, the electrode terminals in a third direction orthogonal to the first direction and the second direction.

According to the semiconductor device of the present disclosure, the middle portion includes a root portion and a first middle portion having a width wider than those a tip portion in the first direction, and a second middle portion having a width wider than that of the root portion in the first direction, a width narrower than that of the first middle portion in the first direction, and a bent portion bent toward in a third direction orthogonal to the first direction and the second direction; therefore, the suppression of insulation failure between the electrode terminals and the suppression of breakage of the electrode terminals due to insufficient strength are simultaneously ensured even bulging occurs in the bent portions.

According to the present disclosure, the method of manufacturing semiconductor device includes a second forming step forming, in the middle portions, a root portion and first middle portions each having a width wider than those of tip portions in the first direction, and second middle portions each having a width wider than that of the root portion in the first direction and narrower than that of the middle portion in the first direction, and a lead forming step bending, in the second middle portions, the electrode terminals in a third direction orthogonal to the first direction and the second direction; therefore, the suppression of insulation failure between the electrode terminals and the suppression of breakage of the electrode terminals due to insufficient strength are simultaneously ensured even bulging occurs in the bent portions.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 2 is a side view of the semiconductor device of FIG. 1;

FIG. 5 is a flowchart illustrating part of a method of manufacturing the semiconductor device of the first embodiment of the present invention;

FIG. 7 is a plan view of the semiconductor device after connecting portion removal of the first embodiment of the present invention;

FIG. 11 is a partially enlarged plan view of a semiconductor device before the connecting portion removal of a second embodiment of the present invention;

FIG. 17 is a partially enlarged plan view of the semiconductor device before the connecting portion removal of a modification example of the third embodiment of the present invention;

FIG. 18 is a partially enlarged plan view of the semiconductor device after the connecting portion removal of the modification example of the third embodiment of the present invention;

DESCRIPTION OF THE PREFERRED EMBODIMENTS

First Embodiment

Figure 1:
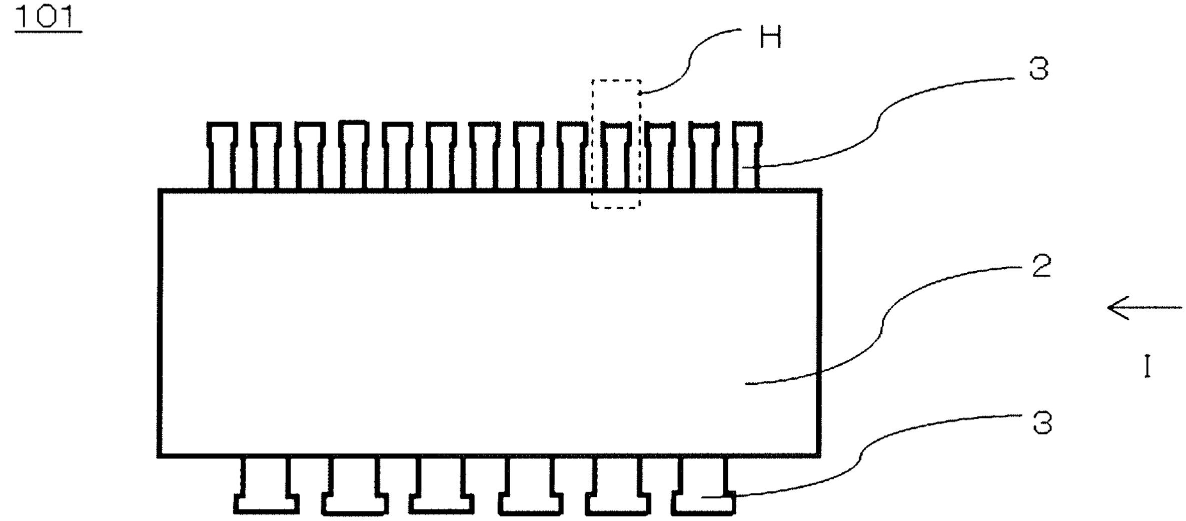
FIG. 1 is a plan view of a semiconductor device according to a first embodiment of the present invention.

In a first embodiment of the present disclosure, a semiconductor device 101 having notches in a connecting removal portion of an electrode terminal will be described as an example. FIG. 1 is a plan view of the semiconductor device 101, and FIG. 2 is a side view of the semiconductor device 101.

The semiconductor device 101 is a resin-sealed intelligent power semiconductor device, in which the semiconductor elements of the power section and control section are mounted on a conductive die bond and sealed with a sealing resin 2, which is an insulating resin, and electrode terminals 3, formed of a lead frame that is a plate-like metal material, protrudes from the sealing resin 2 on both sides. The electrode terminals 3 located on one long side of the sealing resin 2 in the direction connecting the long sides in FIG. 1 are external terminals connected to the control section, and they are designed to be thinner than the electrode terminals 3 for the power section located on the other long side. The electrode terminals 3 adjacent to each other have the same shape and are arranged along the first direction, which is the long side direction, at equal intervals.

FIG. 2 is a side view of the semiconductor device 101 viewed from direction I in FIG. 1. As illustrated in FIG. 2, the electrode terminals 3 have a shape bent substantially at a right angle to a third direction orthogonal to a first direction and a second direction. The electrode terminals 3, which initially extend in the second direction, are bent in the middle thereof in the third direction, and are for mounting the semiconductor device 101 on an external substrate. Therefore, the plurality of electrode terminals 3 are bent in the same third direction. The bending angle may be an obtuse angle instead of a right angle. A bent portion 8 represents a portion the electrode terminal 3 of which portion is bent from the second direction to the third direction.

Figure 3:
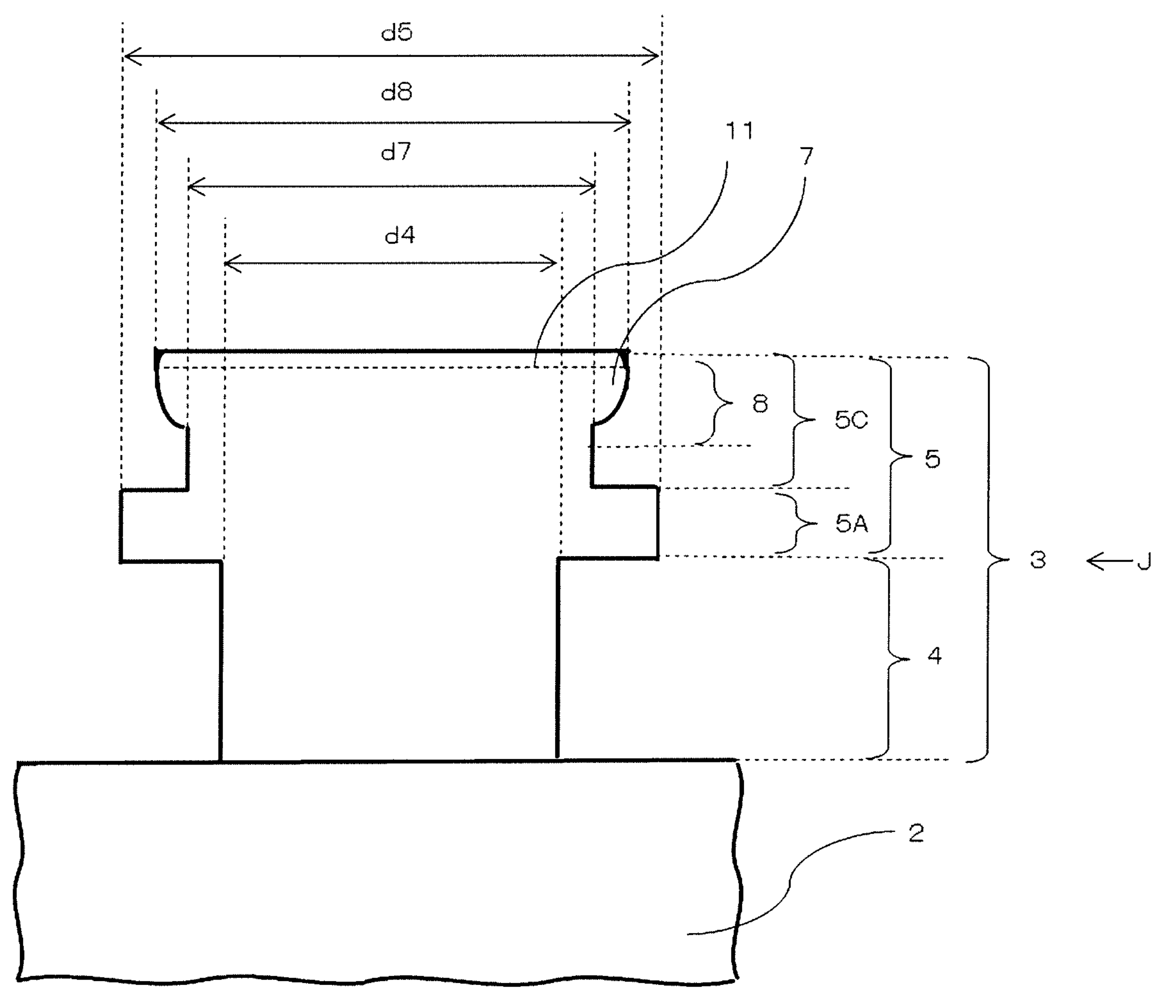
FIG. 3 is a partially enlarged plan view of the semiconductor device of FIG. 1.

FIG. 3 is an enlarged plan view of the portion H, which is the peripheral portion of the electrode terminal 3 in FIG. 1. In the semiconductor device 101, the electrode terminal 3 includes a root portion 4 being a root protruding from the sealing resin 2, a middle portion 5 including a bent portion 8 bent about a bending center 11, and a tip portion 6 (now illustrated) bent to extend in the third direction orthogonal to the root portion 4. In FIG. 3, the tip portion 6 is not illustrated because it is bent at the middle portion 5 in the third direction, that is, from the front toward the back of the sheet surface, and although only the root portion 4 and the side of the middle portion 5 connected to the root portion 4 are illustrated, the tip portion 6 is present on the tip side of the middle portion 5 including the bent portion 8. Details of the bent portion 8 and the bending center 11 will be described later.

The middle portion 5 includes a middle portion 5A connected to the root side o as a first middle portion, and a middle portion 5B (not illustrated) connected to the tip portion 6 (not illustrated), and includes a middle portion 5C interposed between the middle portion 5A and the middle portion 5B as a second middle portion. Also, the middle portion 5C includes a bent portion 8. As described above, FIG. 3 illustrates only the root portion 4 and the side of the middle portion 5 connecting to the root portion 4 of the electrode terminal 3; therefore, the middle portion 5B and a portion on the middle portion 5B side of the middle portion 5C, that is, the portion on the tip portion 6 side are not illustrated, as with the tip portion 6.

Further, the terminal width of the electrode terminal 3 will be described with reference to FIG. 3. First, the root portion 4 has a certain terminal width d4. The middle portion 5A, which is the first middle portion, and the middle portion 5B (not illustrated in FIG. 3) have a terminal width d5 which is greater than the terminal width d4 of the root portion 4 and a terminal width d6 of the tip portion 6 (not illustrated). Further, in the middle portion 5C, which is the second middle portion, has a terminal width d7 connected to the root portion 4, and d7 is greater than the terminal width d4 of the root portion 4 and the terminal width d6 of the tip portion 6, and is smaller than the terminal width d5 of the middle portion 5A. Further, bulging portions 7 occur at the bent portion 8 of the middle portion 5C, and a terminal width d8 at the bulging portions 7 is larger than d4 and d6 and smaller than d5. The occurrence of the bulging portions 7 will be described later.

Figure 4:
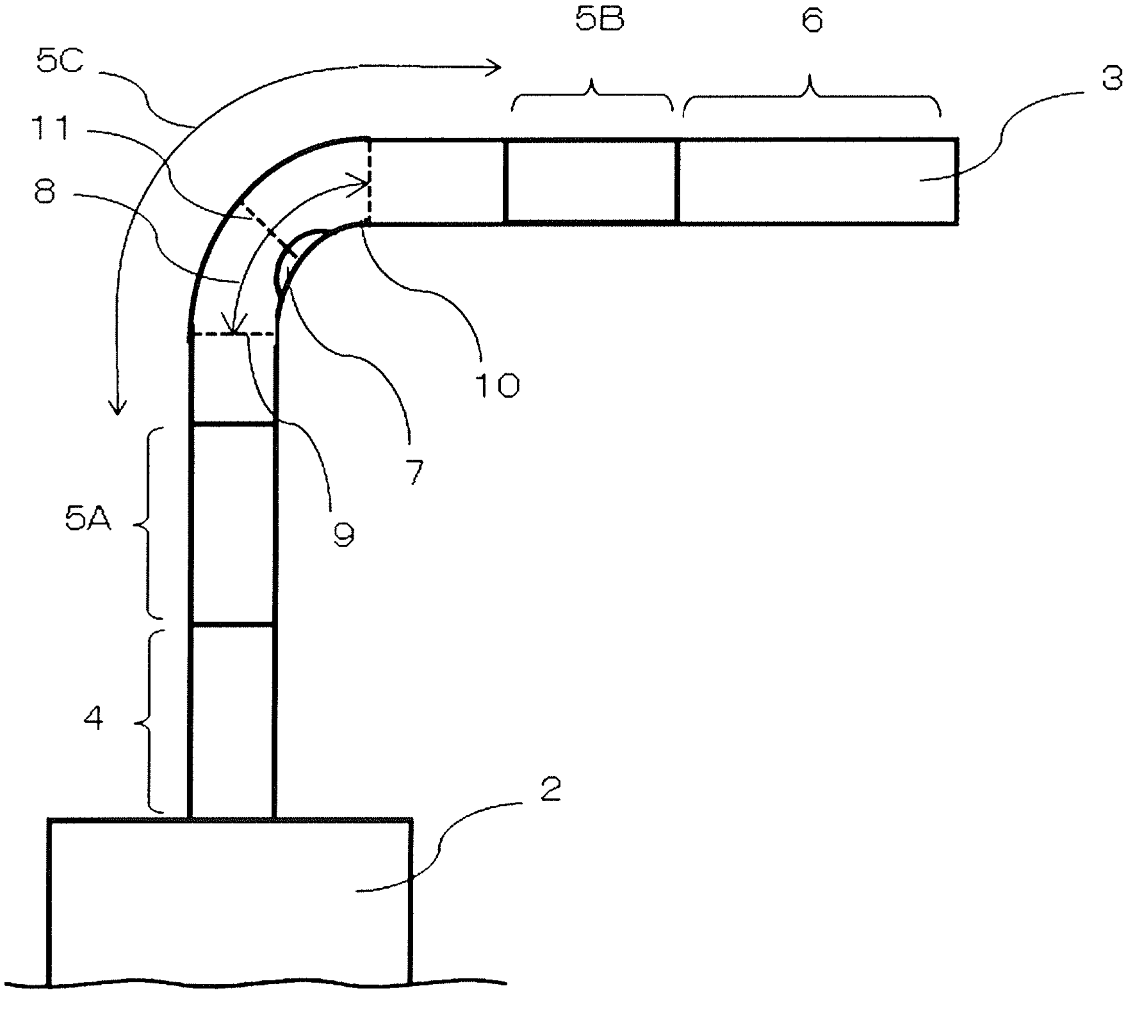
FIG. 4 is a side view of the semiconductor device of FIG. 3.

Next, the bent portion 8 included in the middle portion 5C will be described with reference to FIG. 4. FIG. 4 is a side view illustrating the peripheral portion of the electrode terminal 3 when viewed from the direction J in FIG. 3. The electrode terminal 3 includes a bent portion 8 in the middle portion 5C, and in the present disclosure, a start point of the bent portion 8, that is a position from which a linier portion starts to bend, is defined as a bending start point 9, an end point from which the bending starts to shift to the linier portion, is defined as a bending end point 10, and a position equidistant from the bending start point 9 and the bending end point 10, that is, the center position is defined as the bending center 11. As illustrated in FIG. 4, in the first embodiment, the bending start point 9 and the bending end point 10 are within the range of the middle portion 5C, and naturally the bending center 11 is also within the range of the middle portion 5C.

Next, the mechanism of how the bulging portions 7 occur will be described with reference to FIGS. 3 and 4. Before the electrode terminal 3 is bent, the middle portion 5C has a certain width d7 that is greater than the terminal width d4 of the root portion 4 and smaller than the terminal width d5 of the middle portions 5A and 5B, and no bulging portions 7 occur. However, when bending is performed so that the bent portion 8 is included in the middle portion 5C, portions of the electrode terminal member that spread outward in the terminal width direction are generated in the bent portion 8 as illustrated in FIG. 3. These are the bulging portions 7. The bulging portion 7 occurs by bending where the member of the electrode terminal 3 is stretched on the outer surface of the bend and compressed on the inner surface of the bend, and the member is compressed from both the root side and the tip side and escapes toward outward of the terminal on the inside of the bend of the bend center 11; therefore, as illustrated in FIG. 4, the bulging portion tends to occur on the bend inner surface in a greater manner in size. Further, the bulging amount of the bulging portion 7 is maximized at the bending center 11 of the bent portion 8. On the other hand, in the bent portion 8, expansion and compression of the member is small in the vicinity of the bending start point 9 where the inclination starts from the extension direction from the base portion 4 and in the vicinity of the bending end point 10 where the inclination ends toward the tip portion 6, and the bulge does not necessarily occur.

Next, the method of manufacturing the semiconductor device 101 according to the first embodiment will be described. The semiconductor device 101 is manufactured through four steps, following, a first forming step forming a shape including the electrode terminals 3 on the lead frame, a mounting molding step of arranging the semiconductor chip on the lead frame and sealing the semiconductor chip with an insulating resin, a second forming step of removing a connecting portion and an outer frame, and lead forming in which the electrode terminals 3 are bent. The first forming step and the mounting molding step are the same as those of the manufacturing method of the conventional semiconductor device; therefore, the outline thereof will be described, and the details of the second forming step and the lead forming step will be described.

Figure 6:
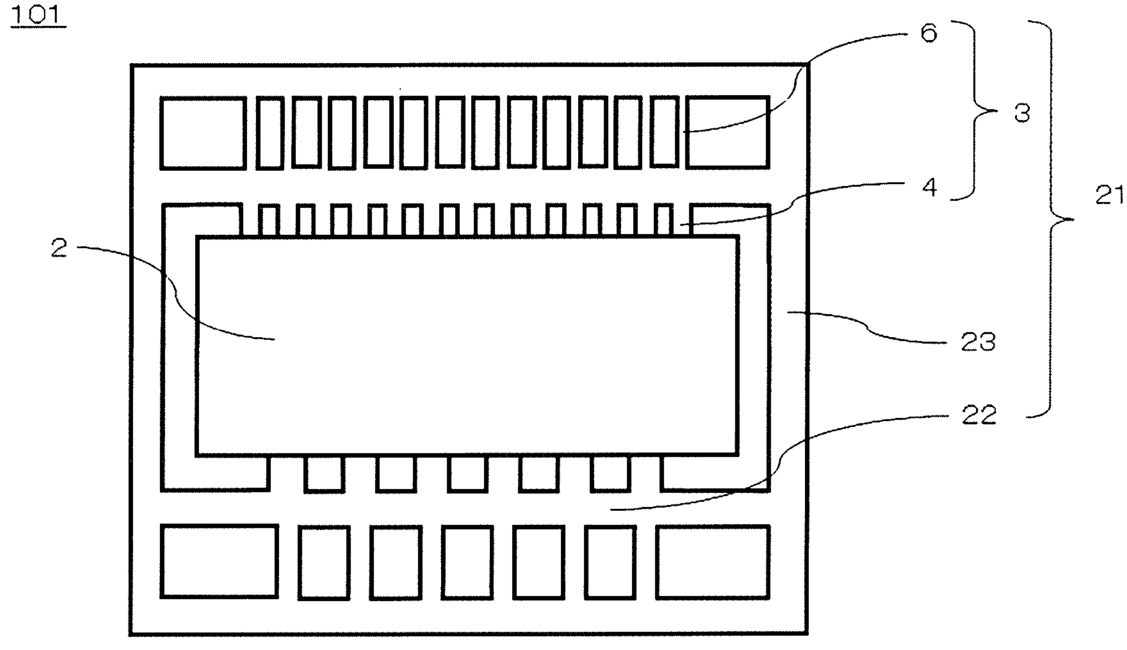
FIG. 6 is a plan view of the semiconductor device after a mounting molding step of the first embodiment of the present invention.

FIG. 6 is a plan view of the semiconductor device after the first forming step and the mounting molding step has been performed. At this point, on each long side of the sealing resin 2 of the semiconductor device 101, a lead frame 21 exposed to the outside is formed with a shape of the root portions 4 and the tip portions 6 of the plurality of electrode terminals 3 arranged in parallel in the first direction and protruding from the sealing resin 2 in the second direction orthogonal to the first direction, and the connecting portions 22 connecting the electrode terminals 3 adjacent to each other between the root portions 4 and the tip portions 6 in the first direction. The connecting portions 22 are formed to suppress deformation of the lead frame 21 in the manufacturing process of the semiconductor device and to suppress outflow of outside of the insulating resin in the mounting molding step. Also, adjacent electrode terminals 3 are integrated with the tip portions 6 of the plurality of electrode terminals 3, and are also connected by an outer frame 23 arranged annularly.

The lead frame 21 in which the electrode terminals 3, the connecting portions 22 and the outer frame 23 are formed is formed by, for example, press-punching the flat plate metal material in the first forming step. Although FIG. 6 illustrates one semiconductor device, in this step, a plurality of semiconductor devices may be arranged on the same lead frame 21 and connected to each other by the lead frame 21 without being separated into individual semiconductor devices.

After the mounting molding step, in the second forming step, the connecting portions 22 and the outer frame 23 are removed from the electrode terminals 3 adjacent to each other to separate the electrode terminals 3 adjacent to each other from each other. In the first embodiment, first, the connecting portion removal is performed, and then the outer frame removal is performed.

Figure 8:
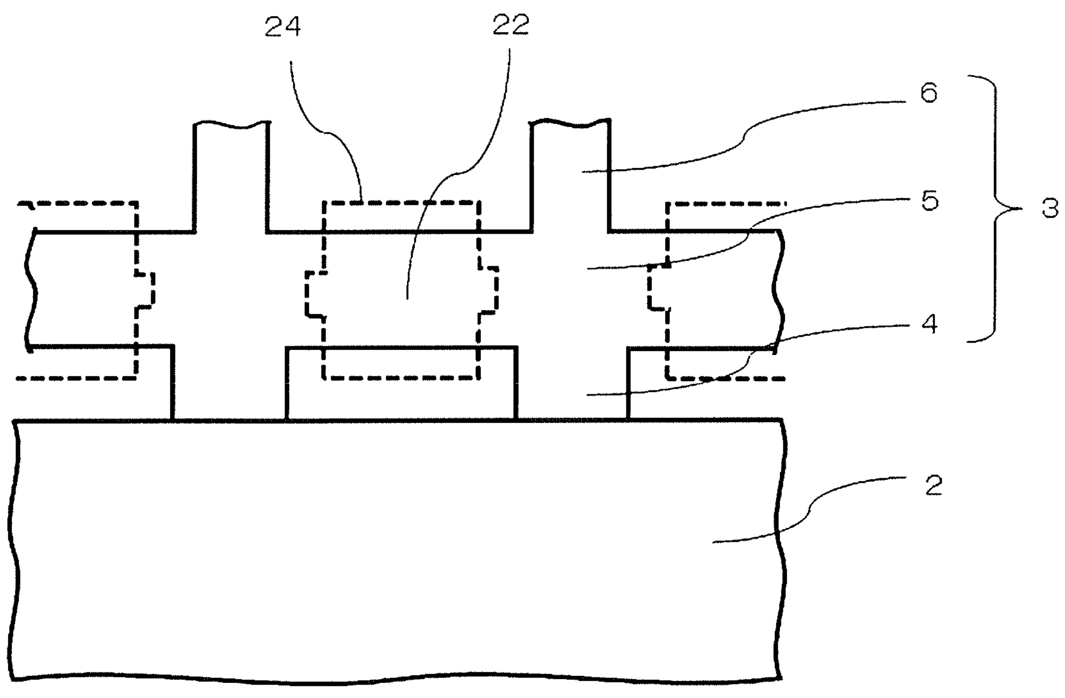
FIG. 8 is a partially enlarged plan view of the semiconductor device before the connecting portion removal of the first embodiment of the present invention.
Figure 9:
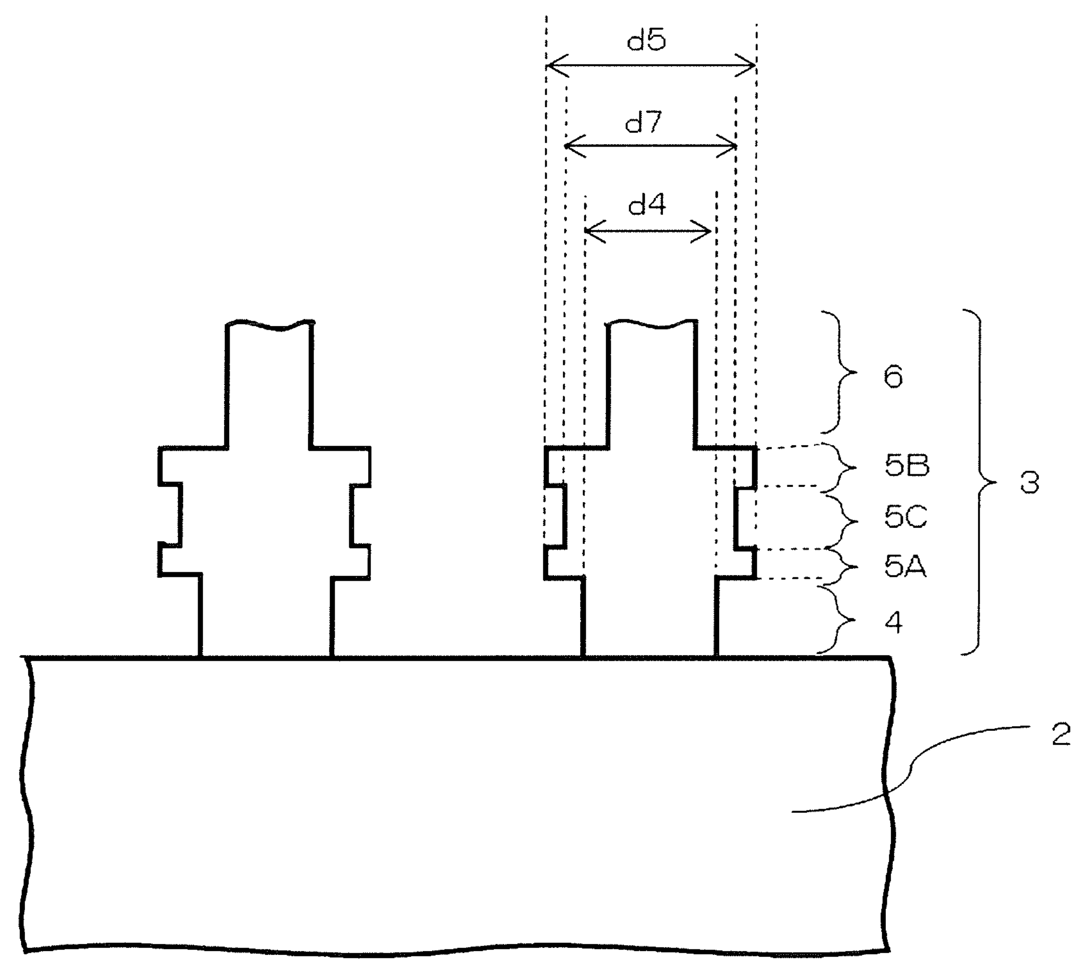
FIG. 9 is a partially enlarged plan view of the semiconductor device before the connecting portion removal of the first embodiment of the present invention.

FIG. 7 is a plan view of the semiconductor device 101 after the connecting portion removal. FIGS. 8 and 9 are enlarged views of a portion K of FIG. 7, with FIG. 8 illustrating the state when the connecting portion removal is in operation and FIG. 9 illustrating the state after the connecting portion removal. The connecting portion removal is a step of removing the connecting portions 22 by press working of punching out from the front and back of the lead frame 21 with a corresponding mold 24. Note that the connecting portion removal is not limited to press working, and cutting work may be adoptable, for example.

In the first embodiment, in the connecting portion removal, the middle portions 5 are formed by leaving portions of the connecting portions 22 on the electrode terminals 3 as illustrated in FIG. 8. Furthermore, using a mold that can form rectangular notches in the connecting removal portions, notches are formed such that the terminal width of the portion with the notches, that is, the terminal width remaining between the right and left notches, is smaller than the width of the connecting removal portion, that is, the terminal width of the area where the connecting portion 22 remains in the portion without the notches, and is greater than the width of the root portion 4 and the tip portion 6. As a result, as illustrated in FIG. 9, the electrode terminal 3 is formed where the connecting removed portion becomes the middle portion 5, the linear remaining portion of the connecting removal portion becomes the first middle portion 5A, which is the first middle portion, and middle portion 5B, and the notches become the second middle portion 5C, which is the second middle portion. Also, the terminal width of the electrode terminal 3 at this point is formed such that d5>d7>d4 and d6 is satisfied where d4 represents the root portion 4, d6 represents the tip portion, d5 represents the middle portions 5A and 5B, and d7 represents the middle portion 5C. Note that the terminal width d7 in the middle portion 5C is set in taking consideration of the bulging amount of the bulging portions 7, which will be described later.

Figure 10:
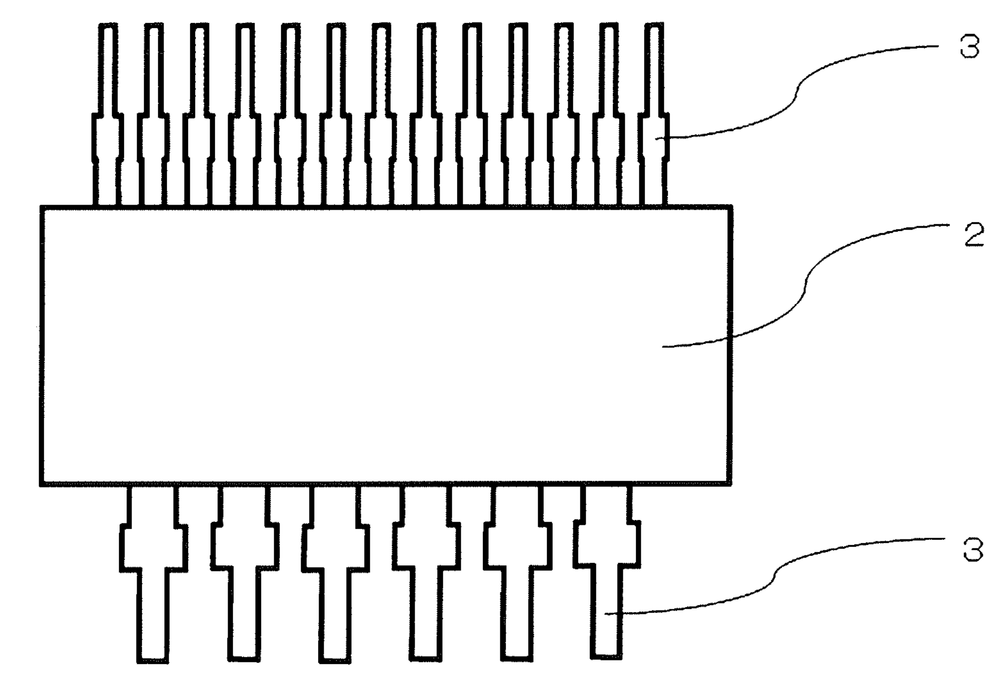
FIG. 10 is a plan view of the semiconductor device after outer frame removal of the first embodiment of the present invention.

After the connecting portion removal, the outer frame removal is performed to cut and remove the outer frame 23 of the lead frame 21. FIG. 10 is a plan view of the semiconductor device 101 after the frame removal. Performing the outer frame removal separates a plurality of semiconductor devices arranged on one lead frame are separated into individual semiconductor devices, and fully separates the electrode terminals 3 adjacent to each other of each semiconductor device.

After the outer frame removal, lead forming for bending the electrode terminals 3 is performed. The lead forming is a step in which the electrode terminals 3 are pressed from above and below with a corresponding L-shaped mold, and the electrode terminals 3 are bent at a substantially right angle. In the first embodiment, the electrode terminals 3 are subjected to bending with the mold being positioned in a manner where the bending centers 11 of the bent portions 8 are to be located at the middle portions 5C, which are notches formed by the connecting portion removal. The semiconductor device 101 after lead forming is as illustrated in FIGS. 1 to 4. Lead forming is performed by setting press conditions and a mold shape in advance so that the bent portions 8 can be bent with a desired curvature. Although the angle at which the electrode terminals 3 are bent is the substantially right angle in the first embodiment, it may be an obtuse angle.

In lead forming, the bulging portion 7 occurs around the bending center 11 of the middle portion 5C, and the bulging amount changes depending on the material and thickness of the electrode terminal 3 as well as the curvature of the bent portion 8. After confirming the bulging amount of the bulging part 7 in advance, in the manufacturing method of the first embodiment, the terminal width d7 of the middle portion 5C in the connecting portion removal step and the curvature of the bent portion 8 in the lead forming are set, such that as illustrated in FIG. 3, the terminal width d8 of the bulging portions 7 is made smaller than the terminal width d5 of the middle portions 5A and 5B. For example, the setting may be performed by providing a designing step before the second forming step. As a result, this ensures, simultaneously, the suppression of the occurrence of insulation failure due to the contact of the bulging portions 7 of the electrode terminals 3 adjacent to each other and the suppression of breakage due to insufficient strength of the bent portions 8.

Further, in the manufacturing method according to the first embodiment, the shape of the middle portion 5 is processed by connecting portion removal, a typical method; therefore, desired semiconductor devices 101 can be manufactured without increasing a step anew leading to an increase in the production period and cost.

A plating step for plating the surface of the electrode terminals 3 after connecting portion removal step may be added for the oxidation prevention of the electrode terminals 3 and the improvement in conductivity depending on the specifications of the product.

In the second forming step of the semiconductor device 101, in the order of connecting portion removal and outer frame removal, either one may be performed first, or they may be performed simultaneously in the same step. However, if the outer frame removal is performed first, the connecting portions are removed after the semiconductor devices are individually separated; therefore, the tips of the electrode terminals 3 are likely to break and bend during the step of the connecting portion removal. Therefore, the outer frame removal may preferably be performed after the connecting portion removal.

In the semiconductor device 101, even in the state where the terminal width is increased due to the occurrence of the bulging portions 7 around the bending center 11 due to bending, the terminal width d8 of the bulging portions 7 is smaller than the terminal width d5 of the middle portions 5A and 5B, and is greater than the terminal width d4 of the root portion 4 and the terminal width d6 of the tip portion 6 even at the terminal width d7 of the middle portion 5C where the bulging portions 7 do not occur. That is, the characteristic is that the terminal width of the middle portion 5C, which is the second middle portion including the bending centers 11, is greater than the terminal width d4 of the root portion 4 in the state of the electrode terminals 3 being bent and the terminal width d6 of the tip portion 6, and is smaller than the terminal width d5 of the middle portion 5A being the first middle portion and the middle portion 5B.

In such a semiconductor device 101, even if the bulging portions 7 occur in the middle portion 5C by bending, the width thereof is smaller than the terminal width d5 of the middle portions 5A and 5B; therefore, the suppression of the occurrence of insulation failure by the electric connection due to the contact of the bulging portions 7 of the electrode terminals 3 adjacent to each other is ensured. In addition, regarding the external force applied to the semiconductor device during bending or after bending, the middle portion 5C has the bending portions 8, so that a force equal to or greater than that of the root portion 4 and the tip portion 6 is applied, in the semiconductor device 101, sufficient strength is secured against such an external force, and the breakage of the electrode terminals 3 is suppressed, because the terminal width d7 of the middle portion 5C being the smallest in terminal width therein is greater than the terminal width d4 of the root portion 4 and the terminal width d6 of the tip portion 6. Further, deformation of the electrode terminals 3 and deterioration of bending accuracy can also be suppressed.

Second Embodiment

While, in the above-described first embodiment, the semiconductor device 101 has been described in which, regarding the middle portion 5C, the middle portion 5A, the middle portion 5B having linear shapes parallel to the second direction, that is, the extending direction of the terminal, and the middle portion 5C, being rectangular notches, are formed by the connecting portion removal, and the lead forming is performed such that the bending centers 11 are to be located at the middle portions 5C, in the second embodiment, a semiconductor device 102 in which the notches of the middle portion 5C have a triangular shape will be described. The only difference from the first embodiment is the shape of the middle portion 5C formed by the connecting portion removal; therefore, the description of this portion will be made, and the description of other portions and the manufacturing method will be omitted.

Figure 12:
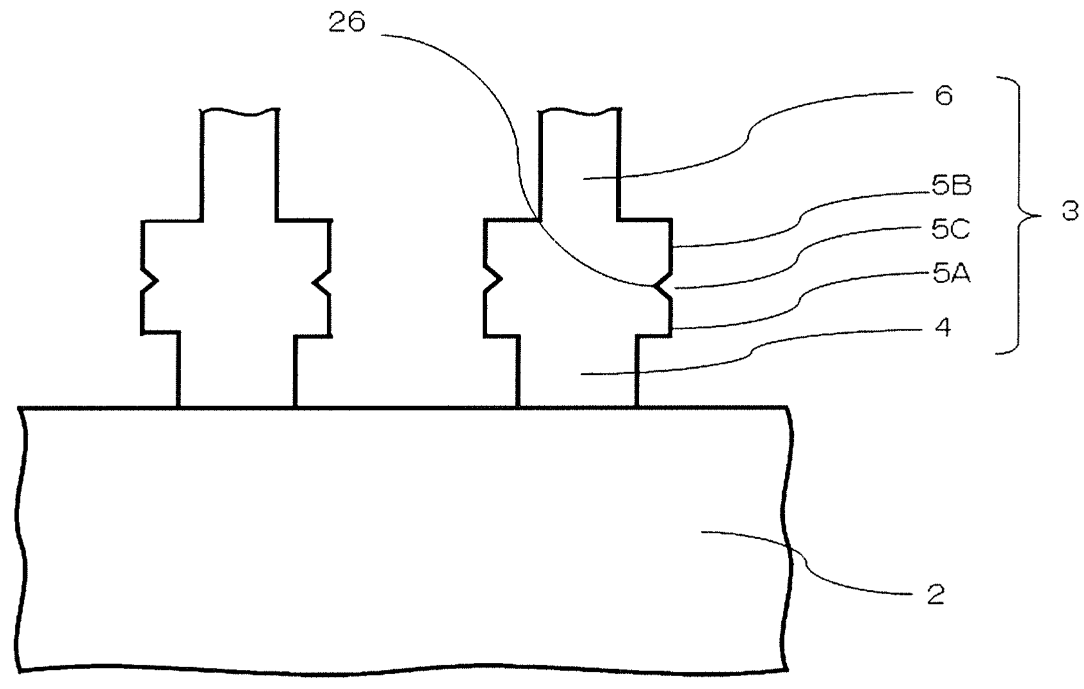
FIG. 12 is a partially enlarged plan view of the semiconductor device after the connecting portion removal of the second embodiment of the present invention.
Figure 13:
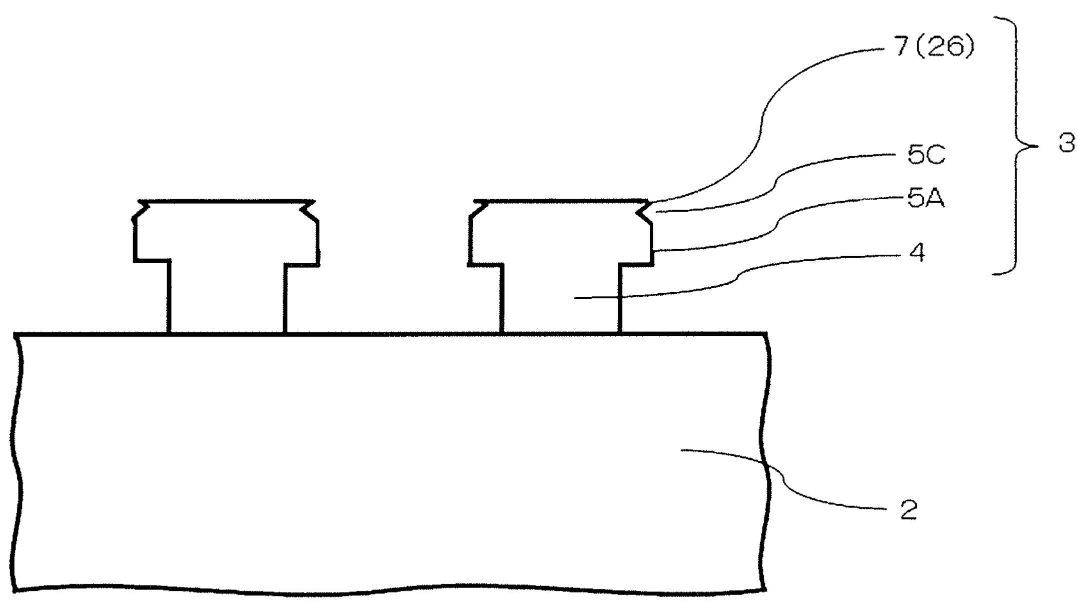
FIG. 13 is a partially enlarged plan view of the semiconductor device after lead forming of the second embodiment of the present invention.

FIGS. 11, 12 and 13 are enlarged plan views of the periphery of the electrode terminals 3 of the semiconductor device 102 according to the second embodiment. FIG. 11 illustrates the state of the connecting portion removal, FIG. 12 illustrates the state after the connecting portion removal, and FIG. 13 illustrates the state after lead forming, respectively. As illustrated in FIG. 11, the connecting portion removal is performed with a mold 25 such that the semiconductor device 102 has triangular notches projecting from the side surfaces parallel to the extending direction of the middle portion 5 of the electrode terminal 3 toward the inside of the middle portion 5. As a result, as illustrated in FIG. 12, the semiconductor device 102 also has middle portion 5A and middle portion 5B wider than the root portion 4, as in the first embodiment, however, unlike the first embodiment, the side surfaces of the middle portion 5C have a triangular notch with one vertex inside the terminal, and the width of the terminal at the position corresponding to a vertex 26 of this triangle is greater than the terminal width d4 of the root portion 4 and the terminal width d6 of the tip portion 6. In FIG. 12, although a triangular notch is adopted as an example, it is sufficient that the length of the notch in the extending direction of the electrode terminal 3 decreases from the side surface parallel to the extending direction of the middle portion 5 of the electrode terminal 3 toward the inside of the middle portion 5; therefore, an arc notch or a rounded notch may also be adopted, for example.

When a triangular notch is formed in the connecting portion removal, lead forming is performed so that the bending center 11 of the bent portion 8 is to be located at the vertex 26 of the triangular notch. Then, as illustrated in FIG. 13, in the middle portion 5C of the electrode terminal 3, a part of the notch of the triangle, that is, a part of each of the two sides of the triangle remains, and further, a shape is provided therein in which the vertex 26 of the triangle becomes the bending center 11 and the bulging portion 7 occurs. That is, the middle portion 5C has a region where the terminal width becomes narrower toward the bending center 11. At this point, even in the bulging portions 7, the width thereof is smaller than the terminal width d5 of the middle portion 5A and the middle portion 5B; therefore, as with the same with the first embodiment, the suppression of insulation failure due to contact between the electrode terminals 3 adjacent to each other and the suppression of breakage of the electrode terminals 3 due to insufficient strength are simultaneously ensured.

Furthermore, in the present embodiment, by making the notch of the middle portion 5C triangular, the width of the bending center 11 having the largest bulging amount is made the narrowest by the connecting portion removal, and then the lead forming is performed, thereby, exhibiting an effect of effectively suppressing the insulation failure between the electrode terminals 3 adjacent to each other. At the same time, even if there is an error in the alignment of the mold and the electrode terminals 3 during lead forming, the positional accuracy of the bending center 11 can be improved because the narrowest terminal width of the bending portion 8 is likely to be the bending center 11. These effects are not limited to the triangular notches illustrated in FIGS. 11 to 13 and a similar effect can be exhibited as long as the notch has a shape where the terminal width is tapered toward the bending center 11.

Note that when lead forming is performed in a manner where notches having a shape in which the length of the notch in the extending direction of the electrode terminal 3 shortens from the side surfaces of the electrode terminal 3 parallel to the extending direction of the middle portion 5 toward inside of the middle portion 5 parallel to the extending direction of the middle portion 5 of the electrode terminal 3, are formed in the middle portion 5C in the connecting portion removal step as in the second embodiment, and when the tapering parts are subjected to lead forming as the bend center 11, parts of the tapering shapes are to be maintained and remains on both sides of the bulging portions 7, if lead forming is performed so that the bulging portions 7 do not exceed the width of the middle portions 5A and 5B. Therefore, the application of the technique illustrated in the second embodiment can be confirmed by the presence or absence of a shape in which the terminal width becomes narrower toward the bending center 11 even after lead forming is performed.

Third Embodiment

In the above first and second embodiments, the semiconductor device 101 and the semiconductor device 102 in which the middle portion 5A is arranged between the middle portion 5C and the root portion 4 and the middle portion. 5B is arranged between the middle portion 5C and the tip portion 6 have been described. in the third embodiment, the middle portion 5A is arranged between the middle portion 5C and the root portion 4, and the middle portion 5B is not arranged between the middle portion 5C and the tip portion 6, that is a semiconductor device 103 and a semiconductor device 104 in which the middle portion 5C and the tip portion 6 are directly connected to each other will be described. The only difference from the first embodiment and the second embodiment is the shape of the middle portion 5 formed by the connecting portion removal; therefore, the description of this portion will be made, and the description of other portions and the manufacturing method will be omitted.

Figure 14:
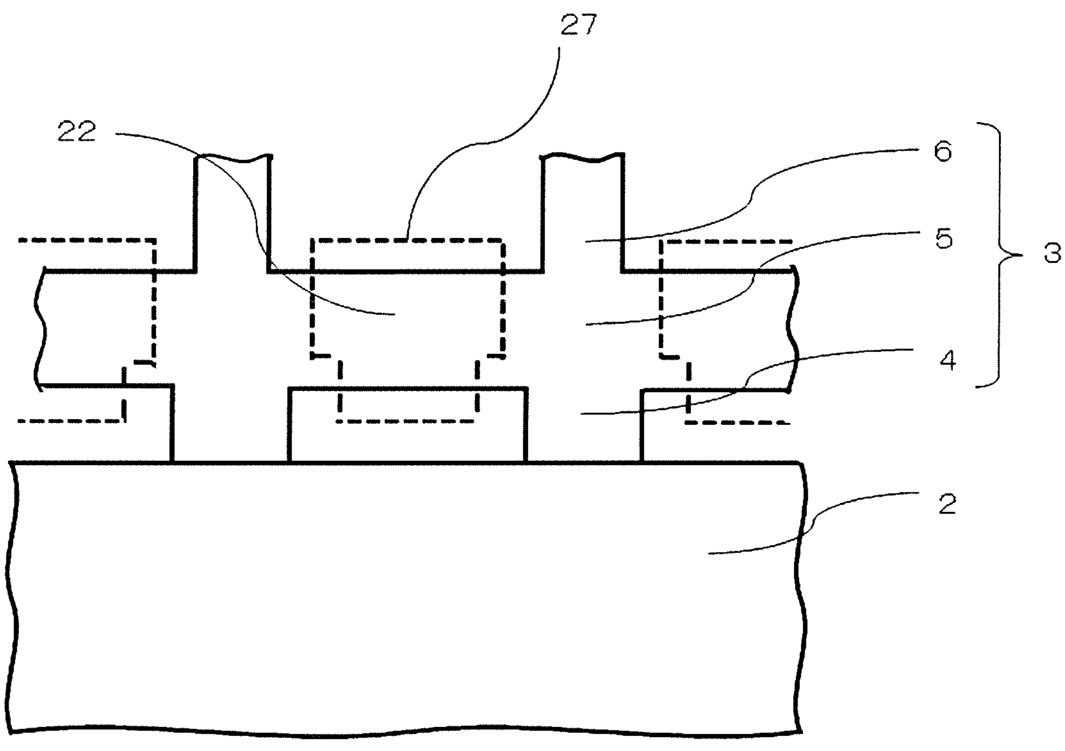
FIG. 14 is a partially enlarged plan view of a semiconductor device before the connecting portion removal of a third embodiment of the present invention.
Figure 15:
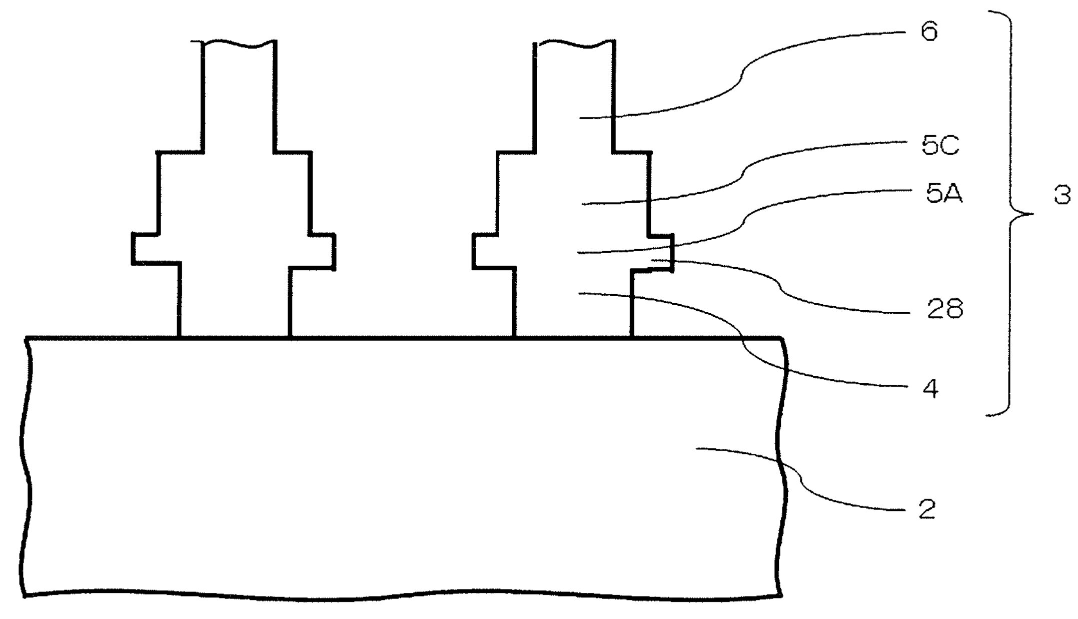
FIG. 15 is a partially enlarged plan view of the semiconductor device after the connecting portion removal of the third embodiment of the present invention.
Figure 16:
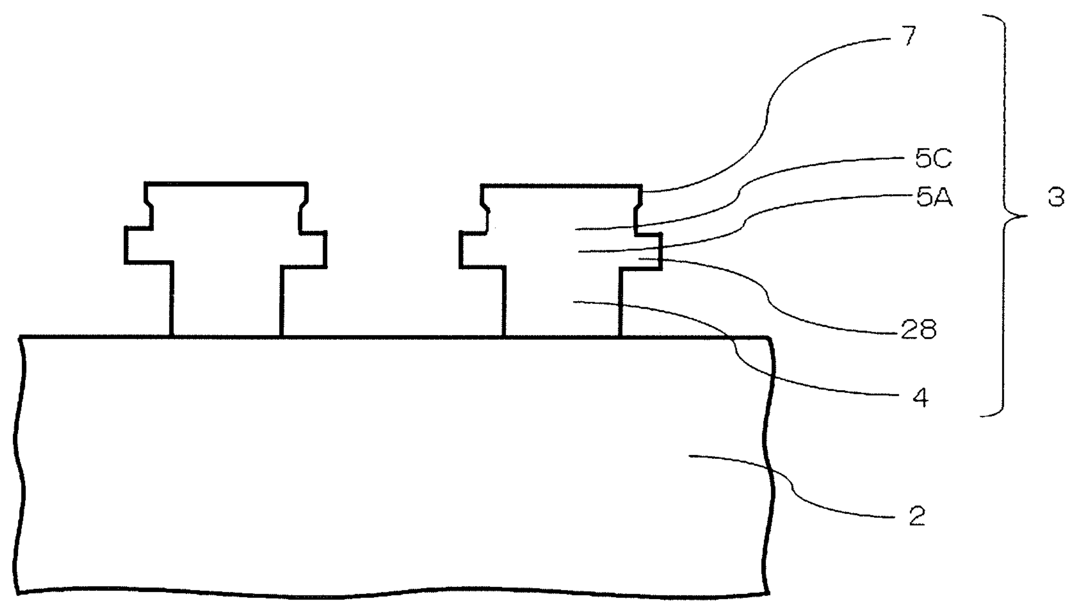
FIG. 16 is a partially enlarged plan view of the semiconductor device after lead forming of the third embodiment of the present invention.

FIGS. 14, 15 and 16 are enlarged plan views of the periphery of the electrode terminals 3 of the semiconductor device 103 according to the third embodiment. FIG. 14 illustrates the state of the connecting portion removal, FIG. 15 illustrates the state after the connecting portion removal, and FIG. 16 illustrates the state after lead forming, respectively. As illustrated in FIG. 14, the semiconductor device 103 is subjected to connecting portion removal by a mold 27 having inwardly convex quadrangular notches at positions corresponding to two corners of a rectangle or square. As a result, as illustrated in FIG. 15, the middle portion 5 has a linear middle portion 5C wider than the root portion 4 and the tip portion 6 as in the first embodiment, and the middle portion 5A has rectangular protrusions 28 that protrude outward in the width direction of the electrode terminal 3. Further, the middle portion 5B provided between the middle portion 5C and the tip portion 6 in the first embodiment does not exist.

The connecting portion removal is performed with such formation, and lead forming is performed so that the bending center 11 is to be located somewhere in the middle portion 5C. Then, as illustrated in FIG. 16, although the bulging portions 7 become the largest near the bending centers 11, the bulging portions 7 are also smaller than the terminal width d5 at the tip of the protrusions 28 of the middle portion 5A; therefore, similar to the first embodiment or the second embodiment, a malfunction due to contact between electrode terminals 3 adjacent to each other can be suppressed, and at the same time, breakage, deformation, and deterioration of bending accuracy due to insufficient strength can be suppressed.

Figure 19:
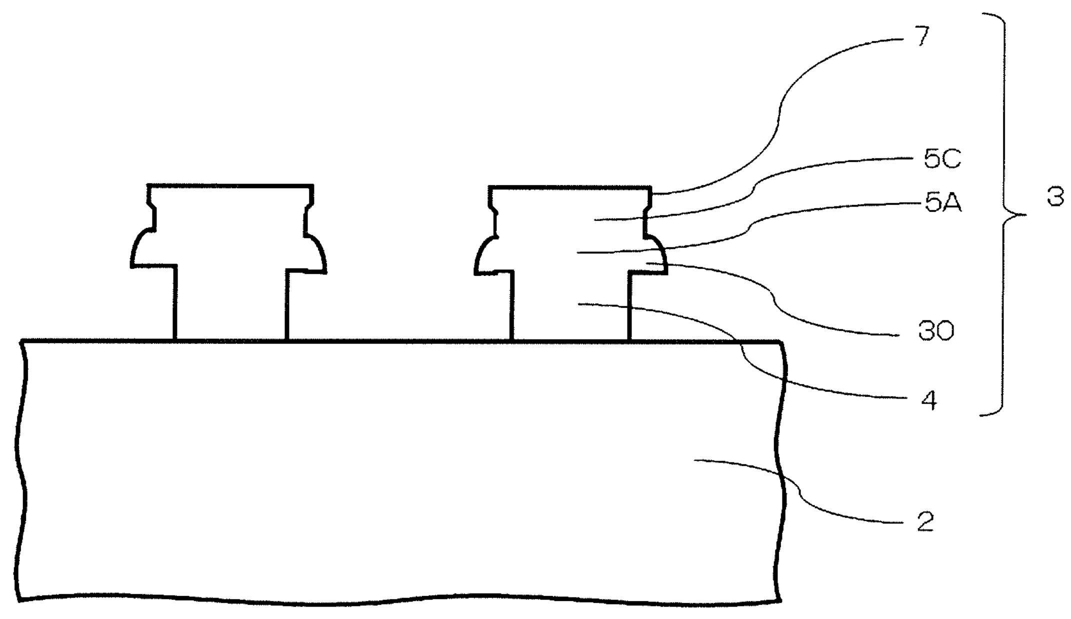
FIG. 19 is a partially enlarged plan view of the semiconductor device after lead forming of the modification example of the third embodiment of the present invention.

FIGS. 17, 18 and 19 are enlarged plan views of the periphery of the electrode terminals 3 of the semiconductor device 104 according to the modification example of the third embodiment. FIG. 17 illustrates the state of the connecting portion removal, FIG. 18 illustrates the state after the connecting portion removal, and FIG. 19 illustrates the state after lead forming, respectively. As illustrated in FIG. 17, the semiconductor device 104 is subjected to connecting portion removal with a mold 29 having notches having an inwardly convex curve on two corners of a square. As a result, in comparison with the semiconductor device 103, in the shape of the electrode terminal 3 of the semiconductor device 104, the middle portion 5A is provided with an outlined having a first side which is a curb protruding in the outward direction with respect to the electrode terminal 3 and a second side which is a straight line extending in the width direction of the electrode terminal 3, which is a protrusion 30 protruding in the width direction of the electrode terminal 3. Therefore, the semiconductor device 104 can also exhibit the same effects as those of the first or second embodiment, as the semiconductor device 103.

Further, in the third embodiment, as illustrated in FIG. 14 or FIG. 17, the mold 27 or the mold 29 having notches at positions corresponding to two corners of a rectangle or square is used in the connecting portion removal step. The mold 27 and the mold 29 are manufactured by processing a rectangular or square mold member with notches at its two corners. The number of notches is smaller than that of the mold 24 manufactured by processing with notches at its four corners used in the first embodiment. Therefore, the workability is improved in manufacturing the mold, and the manufacturing cost of the mold, which is a consumable item, can be suppressed. In addition, the notch of the middle portion 5 is less complicated than that of the first embodiment; therefore, workability is improved in the semiconductor device manufacturing process, for example, in managing the processing accuracy.

In the third embodiment, the middle portion 5A is arranged between the middle portion 5C and the root portion 4, and the middle portion 5B is not arranged between the middle portion 5C and the tip portion 6, that is, the semiconductor devices 103 and 104 to which the middle portion 5C and the tip portion 6 are directly connected to each other have been described. The middle portion 5B may be arranged between the middle portion 5C and the tip portion 6, and the middle portion 5A may not be arranged between the middle portion 5C and the root portion 4, and the middle portion 5C and the root portion 4 may be directly connected, thereby exhibiting the similar effect.

Fourth Embodiment

In the first embodiment, the semiconductor device 101 has been described in which, regarding to the middle portion 5, the middle portions 5A and 5B having linear shapes parallel to the extending direction of the terminal and the middle portion 5C having rectangular notches are formed by the connecting portion removal, and lead forming is performed in a manner where the bending centers 11 are to be located in the middle portion 5C. In the fourth embodiment, a semiconductor device 105 in which groove processing is performed on the middle portion 5C of the square notch in the first embodiment will be described. The only difference from the first embodiment is in that groove processing is performed; therefore, the description of this portion will be made, and the description of other portions and the manufacturing method will be omitted.

Figure 20:
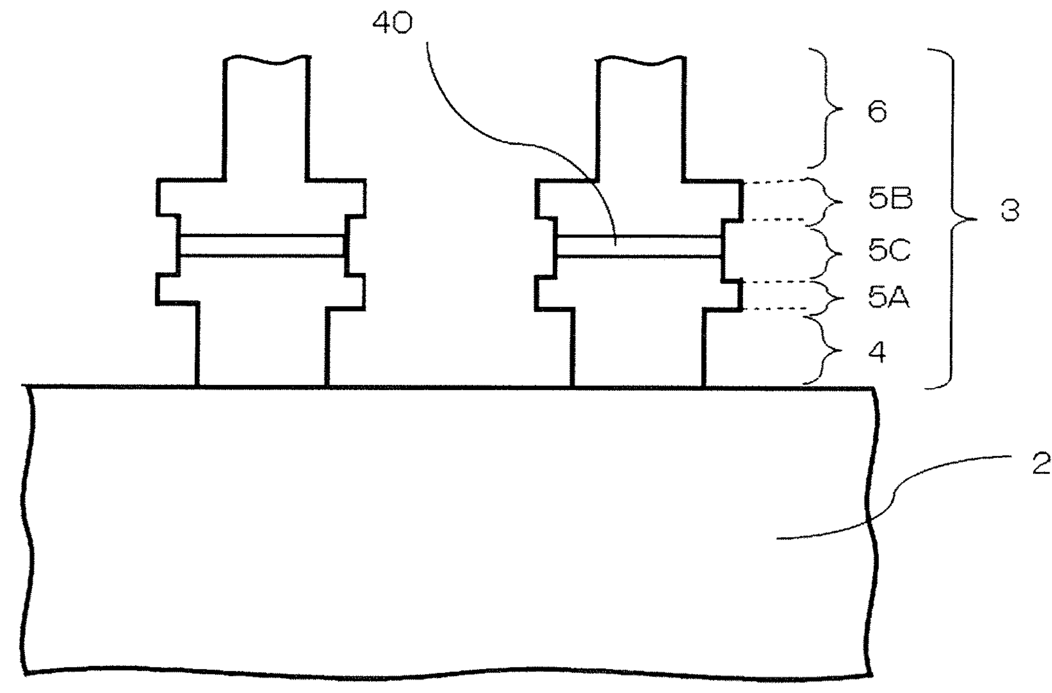
FIG. 20 is a partially enlarged plan view of a semiconductor device after the connecting portion removal of a fourth embodiment of the present invention.

FIG. 20 is an enlarged plan view of the peripheral portion of the electrode terminals 3 after connecting portion removal of the semiconductor device 105 according to the fourth embodiment. As illustrated in FIG. 20, the semiconductor device 105 also includes the middle portions 5A and 5B wider than root portion 4 and tip portion 6, as in the first embodiment. However, unlike the first embodiment, the middle portion 5C has a groove 40 extending in the width direction of the electrode terminal 3 on a side on one side in a portion where the rectangular notches are formed. The surface on which the groove 40 is provided is referred to as a first main surface, and the opposite surface is referred to as a second main surface.

In the subsequent lead forming, bending is performed with the position of the groove 40 as the bending center 11 so that the first main surface becomes an inner bending surface and the second main surface becomes an outer bending surface. At this point, the thickness of the electrode terminal 3 is small in the portion of the groove 40; therefore, the bulging amount of the bulging portion 7 can be suppressed compared to the case where no groove 40 is present. At the same time, the groove 40 serves as the bending center 11 during lead forming, this makes bending easier, leading to the effect of improving the accuracy of the bending position. Meanwhile, however, the deeper or wider the groove 40 is, the lower the strength of the electrode terminal 3 is; therefore, an appropriate value may be set in consideration of the balance between bendability and strength. The groove processing may be performed in any one of the processes prior to lead forming, and press working, cutting work, or the like may be adopted. The bulging portion 7 is more likely to occur on the first main surface side where the member is compressed, which becomes the inner bending surface than on the second main surface side where the member is stretched, which becomes the outer bending surface; therefore, a greater effect of suppressing the bulging amount is obtained if the groove 40 is formed on the first main surface, however, the groove 40 may be formed on the second main surface or may be formed on both surfaces.

By providing the groove 40 in the middle portion 5C in this manner, the suppression of the bulging amount of the bulging portion 7 and the improvement of the accuracy of the bending position are ensured. Accordingly, as in the first embodiment, the effects can be exhibited where a malfunction due to contact between electrode terminals 3 adjacent to each other can be suppressed, and at the same time, breakage, deformation, and deterioration of bending accuracy due to insufficient strength can be suppressed and the positional accuracy of the bending center 11 can be improved.

Although in the fourth embodiment, the electrode terminal 3 has the shape described in the first embodiment, regardless of such shape, the groove 40 may be provided in the shape of the electrode terminal 3 in the second and third embodiments. In any case, the effect is exhibited by matching the positions of the bending center 11 and the groove 40.

The groove 40 can also be confirmed by analyzing the cross section of the electrode terminal 3 after the electrode terminal 3 is bent.

Although in the semiconductor device 101 of the first embodiment, as illustrated in FIG. 3, the bending start point 9 and the bending end point 10 are included in the middle portion 5C, the bending start point 9 may be included in the root portion 4 or the middle portion 5A, alternatively, the bending end point 10 may be included in the tip portion 6 or the middle portion 5B. That is, it is sufficient that the bending center 11 is included in the middle portion 5C. The bulging portion 7 is the largest at the bending center 11; therefore, as long as the width d8 of this portion is smaller than the terminal width d5 of the middle portions 5A and 5B, the effect of suppressing the contact between the electrode terminals 3 adjacent to each other can be obtained. If a part of the bulging portion 7 reaches the middle portion 5A or the middle portion 5B due to the bending and the electrode terminals 3 adjacent to each other come into contact with each other, the curvature of the bending portion 8 is reduced and the bending conditions may be changed so that the bending start point 9 and the bending end point 10 are included in the range of the middle portion 5C. This also applies to the second to fourth embodiments.

Further, in the first to fourth embodiments, the shapes of the middle portions 5 of the electrode terminals 3 are all symmetrical with respect to the extending direction. However, if the shape of the electrode terminals 3 adjacent to each other is the same, it is not limited to horizontal symmetry. For example, only one of the notches provided on both side surfaces of the middle portion 5C of the electrode terminal 3 in the second direction, which is the extending direction of the electrode terminal 3, may be provided in FIGS. 9, 12, 15, and 18. Also, the notches on both sides may have different shapes. However, if the shapes of both side surfaces of the electrode terminal 3 is made asymmetrical, the electrode terminal 3 may easily bend in the first direction orthogonal to the second direction during lead forming; therefore, it is desirable that the shapes be symmetrical with respect to the second direction.

While the disclosure has been illustrated and described in detail, the foregoing description is in all aspects illustrative and not restrictive. It is therefore understood that numerous modifications and variations can be devised without departing from the scope of the invention.

What is claimed is:

1. A semiconductor device comprising:

a conductive die bond;

a semiconductor element electrically connected to the die bond;

a sealing resin being an insulating resin sealing the semiconductor element therein; and a plurality of electrode terminals electrically connected to the die bond and protruding from the sealing resin each including a root portion being a root protruding from the sealing resin, a tip portion being a tip and portion extending from the root portion, and a middle portion provided between the tip portion and the root portion, wherein the plurality of electrode terminals are aligned along a first direction and protrude from the sealing resin in a second direction orthogonal to the first direction, and the middle portion includes a first middle portion having a width wider than those of the root portion and the tip portion in the first direction, and a second middle portion having a width wider than that of the root portion in the first direction, and a width narrower than that of the first middle portion in the first direction, and having a bent portion bent toward in a third direction orthogonal to the first direction and the second direction, the bent portion having a bending center being a center between a bending start point being a start point of bending and a bending end point being an end point of bending, and the bending center is located in the second middle portion.

2. The semiconductor device according to claim 1, wherein the second middle portion has bulging portions bulging in width in the first direction, the width of the second middle portion in the first direction is a maximum at a position where the bulging portions are arranged.

3. The semiconductor device according to claim 2, wherein the second middle portion has a region where a width in the first direction becomes narrower from one of the bending start point and the bending end point or from both toward the bending center.

4. The semiconductor device according to claim 2, wherein the second middle portion has a groove extending in the first direction in an inner bending surface, and the groove is formed at a position overlapping the bending center in the inner bending surface.

5. The semiconductor device according to claim 3, wherein the second middle portion has a groove extending in the first direction in an inner bending surface, and the groove is formed at a position overlapping the bending center in the inner bending surface.

6. The semiconductor device according to claim 1, wherein the second middle portion has a region where a width in the first direction becomes narrower from one of the bending start point and the bending end point or from both toward the bending center.

7. The semiconductor device according to claim 1, wherein the second middle portion has a groove extending in the first direction in an inner bending surface, and the groove is formed at a position overlapping the bending center in the inner bending surface.

8. The semiconductor device according to claim 1, wherein the bending start point and the bending end point are located in the second middle portion.

9. The semiconductor device according to claim 8, wherein the second middle portion has bulging portions bulging in width in the first direction, the width of the second middle portion in the first direction is a maximum at a position where the bulging portions are arranged.

10. The semiconductor device according to claim 9, wherein the second middle portion has a region where a width in the first direction becomes narrower from one of the bending start point and the bending end point or from both toward the bending center.

11. The semiconductor device according to claim 9, wherein the second middle portion has a groove extending in the first direction in an inner bending surface, and the groove is formed at a position overlapping the bending center in the inner bending surface.

12. The semiconductor device according to claim 10, wherein the second middle portion has a groove extending in the first direction in an inner bending surface, and the groove is formed at a position overlapping the bending center in the inner bending surface.

13. The semiconductor device according to claim 8, wherein the second middle portion has a region where a width in the first direction becomes narrower from one of the bending start point and the bending end point or from both toward the bending center.

14. The semiconductor device according to claim 8, wherein the second middle portion has a groove extending in the first direction in an inner bending surface, and the groove is formed at a position overlapping the bending center in the inner bending surface.

15. The semiconductor device according to claim 1, wherein the electrode terminal has the first middle portion at least one of between the second middle portion and the root portion or between the second middle portion and the tip portion.

* * * * *